(12) United States Patent
Gordon et al.

(10) Patent No.: US 7,515,460 B2
(45) Date of Patent: Apr. 7, 2009

(54) MULTILEVEL PROGRAMMING OF PHASE CHANGE MEMORY CELLS

(75) Inventors: George Gordon, Sunnyvale, CA (US); Stephen Hudgens, Santa Clara, CA (US); Fabio Pellizzer, Follina (IT); Agostino Pirovano, Corbetta (IT)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/606,762

(22) Filed: Nov. 30, 2006

(65) Prior Publication Data

US 2007/0077699 A1 Apr. 5, 2007

Related U.S. Application Data

(62) Division of application No. 11/042,757, filed on Jan. 25, 2005, now Pat. No. 7,391,642.

(51) Int. Cl.
*G11C 11/00* (2006.01)
(52) U.S. Cl. ........................................ 365/163; 365/148
(58) Field of Classification Search ................ 365/46, 365/148, 163
See application file for complete search history.

(56) References Cited

U.S. PATENT DOCUMENTS

| | | | | |
|---|---|---|---|---|
| 4,653,024 A * | 3/1987 | Young et al. | ................. | 365/113 |
| 5,536,947 A * | 7/1996 | Klersy et al. | ................... | 257/3 |
| 6,452,891 B1 * | 9/2002 | Hennessey | .................. | 369/116 |
| 6,671,710 B2 * | 12/2003 | Ovshinsky et al. | .......... | 708/493 |
| 6,813,177 B2 * | 11/2004 | Lowrey et al. | .............. | 365/148 |
| 6,816,404 B2 * | 11/2004 | Khouri et al. | ................ | 365/163 |
| 6,914,801 B2 * | 7/2005 | Kostylev et al. | ............. | 365/113 |
| 6,967,865 B2 * | 11/2005 | Lee | ............. | 365/163 |
| 7,106,623 B2 * | 9/2006 | Hung et al. | ................. | 365/163 |
| 7,272,037 B2 * | 9/2007 | Lee et al. | ..................... | 365/163 |
| 7,323,707 B2 * | 1/2008 | Dennison | ....................... | 257/2 |

* cited by examiner

*Primary Examiner*—Van Thu Nguyen
*Assistant Examiner*—Alexander Sofocleous
(74) *Attorney, Agent, or Firm*—Trop, Pruner & Hu, P.C.

(57) ABSTRACT

A method for programming a phase change memory cell is discussed. A phase change memory cell includes a memory element of a phase change material having a first state, in which the phase change material is crystalline and has a minimum resistance level, a second state in which the phase change material is amorphous and has a maximum resistance level, and a plurality of intermediate states, in which the phase change material includes both crystalline regions and amorphous regions and has intermediate resistance levels. According to the method, a plurality of programming pulses are provided to the phase change memory cell; programming energies respectively associated to the programming pulses are lower than a threshold energy which is required to bring the phase change material to the second state.

9 Claims, 5 Drawing Sheets

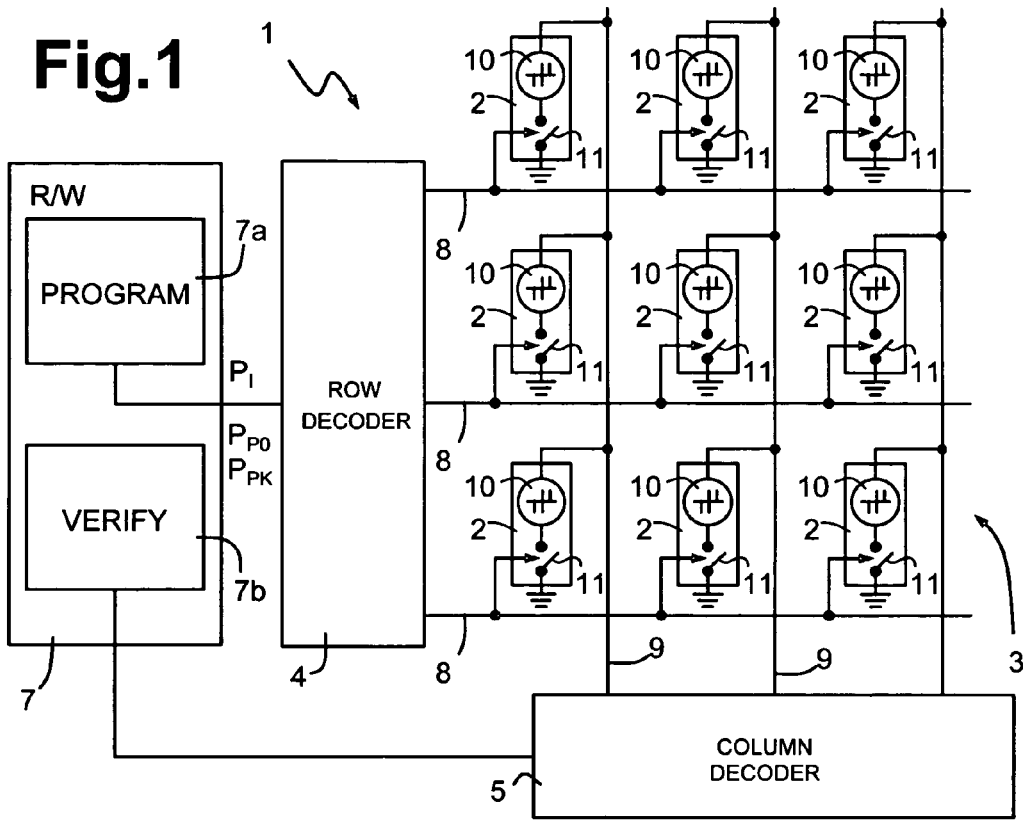
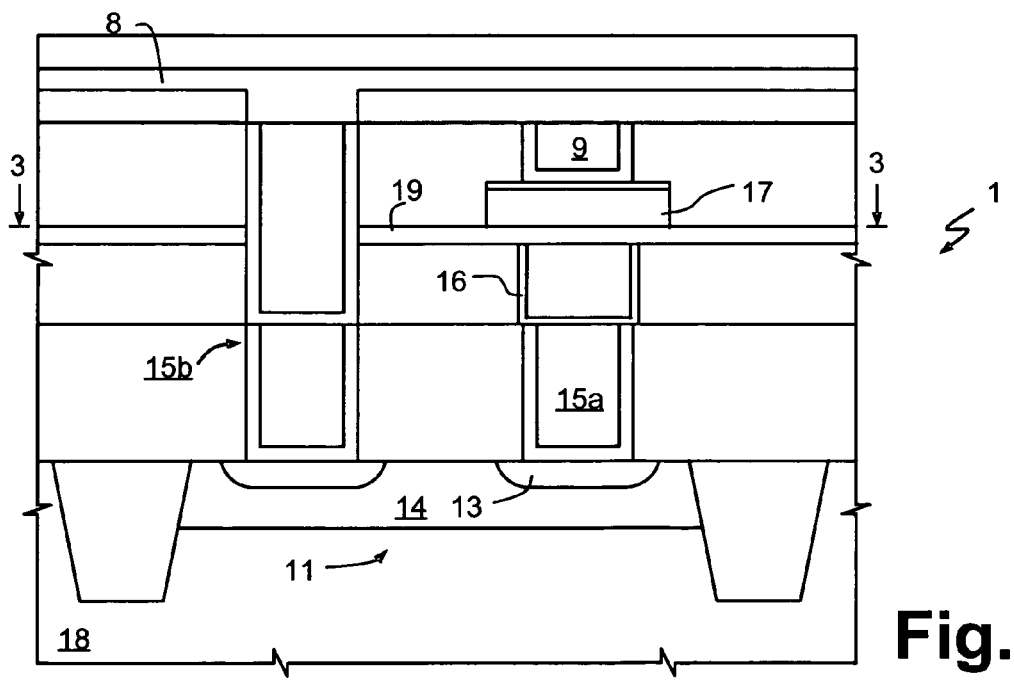

MULTILEVEL PROGRAMMING OF PHASE CHANGE MEMORY CELLS

CROSS-REFERENCE TO RELATED APPLICATIONS

This application is a divisional of U.S. patent application Ser. No. 11/042,757, filed on Jan. 25, 2005 now U.S. Pat. No. 7,391,642.

BACKGROUND

The present invention relates to programming phase change memory cells.

Phase change memories use a class of materials that switch between two phases having distinct electrical characteristics, associated with two different crystallographic structures, and precisely an amorphous, disorderly phase and a crystalline or polycrystalline, orderly phase. The two phases are hence associated with resistivities of different values.

Currently, the alloys of elements of group VI of the periodic table, such as Te or Se, referred to as chalcogenides or chalcogenic materials, can be used advantageously in phase change memory cells. The currently most promising chalcogenide is formed from an alloy of Ge, Sb and Te ($Ge_2Sb_2Te_5$).

The resistivity of phase change materials may vary by several orders of magnitude upon switching between the fully set (crystalline) state to the fully reset (amorphous) state. However, the resistivity of the amorphous chalcogenic material is not stable and continuously increases after phase transition. Thus, a quite rapid resistivity drift may take place, especially when large extensions of chalcogenic material are brought to the amorphous state.

The resistivity drift does not normally cause major problems in conventional two-level phase change memory cells because of the gap between the set state and the reset state. Multilevel programming is not compatible with the resistivity drift because of the smaller gap between the intermediate programming levels. Thus, a sense amplifier may fail to distinguish adjacent levels in a relatively short time after each phase transition. Moreover, large amorphous regions are created that unpredictably affect the resistivity level. Thus, repeating identical programming cycles on the same phase memory change cell may lead to different resistivity levels.

Thus there is a need for other ways to implement multilevel phase change memories.

BRIEF DESCRIPTION OF THE DRAWINGS

For the understanding of the present invention, preferred embodiments thereof are now described, purely as a non-limitative example, with reference to the enclosed drawings, wherein:

FIG. 1 shows a simplified block diagram of a phase change memory device implementing a programming method according to a first embodiment of the present invention;

FIG. 2 is a cross section through a memory cell of the phase change memory device of FIG. 1;

DETAILED DESCRIPTION

Figure 3:
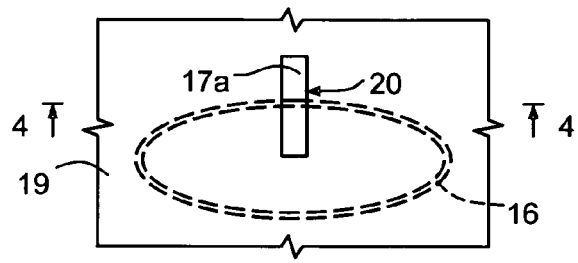
FIG. 3 is a top plan view, taken along the line 3-3 of FIG. 2, of an enlarged detail of the memory cell of FIG. 2.

As shown in FIG. 1, a phase change memory ("PCM" hereinafter) device 1 comprises a plurality of PCM cells 2, arranged in rows and columns to form an array 3, a row decoder 4, a column decoder 5 and a read/write unit 7, further including a programming circuit 7*a* and a verify circuit 7*b*. Word lines 8 and bit lines 9 run parallel to rows and columns, respectively, and are selectively connectable to the read/write unit 7 through the row decoder 4 and the column decoder 5.

Each PCM cell 2 is coupled at a cross-point of a word line 8 and a bit line 9 and includes a memory element 10, of the phase change type, and a selection element 11. In each PCM cell 2, the memory element 10 has a first terminal connected to a bit line 9 and a second terminal connected to a first terminal of the selection element 11. The selection element 11 has a second terminal grounded and a control terminal connected to a word line 8. According to one alternate solution, the memory element 10 and the selection element 11 of each PCM cell 2 may be exchanged in position. Moreover, the selection elements 11 may have two terminals only (e.g. diodes).

The programming circuit 7*a* provides initialization pulses $P_I$ and programming pulses $P_{PO}$, $P_{PK}$ (either current or voltage pulses) to selected PCM cells 2, according to a programming method described later. The verify circuit 7*b* is coupled to the selected PCM cells 2 for reading the information stored therein after each programming step.

Referring to FIG. 2, the selection element 11 may be a PNP bipolar transistor having an emitter region 13, a base region 14 and emitter and base contacts 15*a*, 15*b*. An intrinsic collector of the selection element 11 may be formed in a semiconductor substrate 18, wherein the whole array 3 is integrated.

A cup-shaped heating element 16 may be formed on the emitter contact 15*a*. An upper portion of the heating element 16 may define a circular or oval upper edge having sublithographic thickness, as also shown in FIG. 3. The term "sublithographic" means having a linear dimension smaller than the minimum dimension achievable with current optical (UV) lithographic techniques, and hence smaller than 100 nm. The sublithographic thickness may be as little as 50-60 nm, or even 5-20 nm.

A strip 17 of a chalcogenic material, (e.g. $Ge_2Sb_2Te_5$) runs parallel to the bit lines 9 and is separated from the heating element 16 by a non-chalcogenic layer 19 (such as a dielectric layer) as shown in FIG. 2. However, an elongated minitrench 20 (see also FIG. 3) is formed through the layer 19 above and across the heating element 16 in a direction parallel to the bit lines 9.

Figure 4:
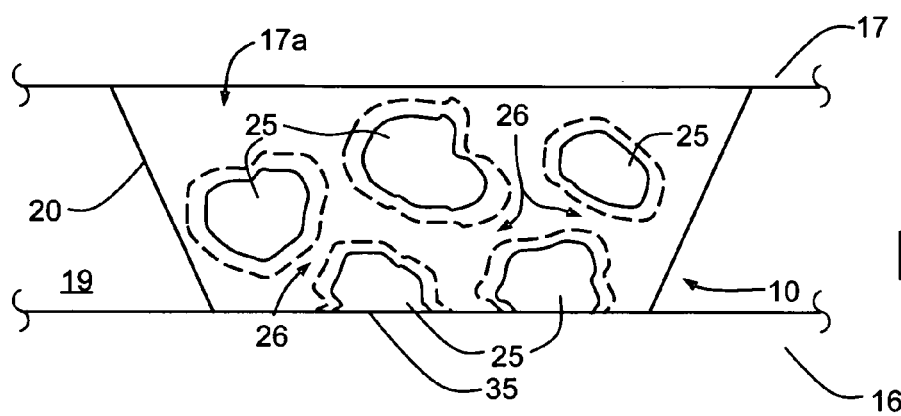
FIG. 4 is a cross section of the detail of FIG. 3, taken along the line 4-4 of FIG. 3 and further enlarged.

Thus, a thin portion 17*a* of the strip 17 fills the minitrench 20 and contacts the heating element 16, as shown in FIG. 4. The minitrench 20 has a sublithographic width in a direction parallel to the word lines 8, so that a contact area 35 between the thin portion 17*a* of the strip 17 and the heating element 16 has a sublithographic dimension as well.

Crystallites 25 may be formed in the crystalline or set state. Thus crystallites may be separated by separation regions 26 in the amorphous phase. In states intermediately between the set and reset states both crystallites 25 and separation regions 26 connect.

The memory element 10 of the PCM cell 2 is formed in the thin portion 17a of the strip 17 at the contact area 35. On account of the sublithographic dimension of the contact area 35, even relatively small currents flowing through the strip 17 and the heating element 16 provide sufficient heating by the Joule effect to cause phase transitions in a volume corresponding to the memory element 10.

Information stored in PCM cells 2 is associated with predetermined resistance levels (programming states) of the chalcogenic material forming the memory elements 10. Hereinafter, specific resistance levels and ranges will be provided by way of example; however, it is understood that the invention is not limited thereto. For example, scaling of devices may reduce the dimensions of the memory elements 10 and will correspondingly increase their resistance levels.

Figure 5:
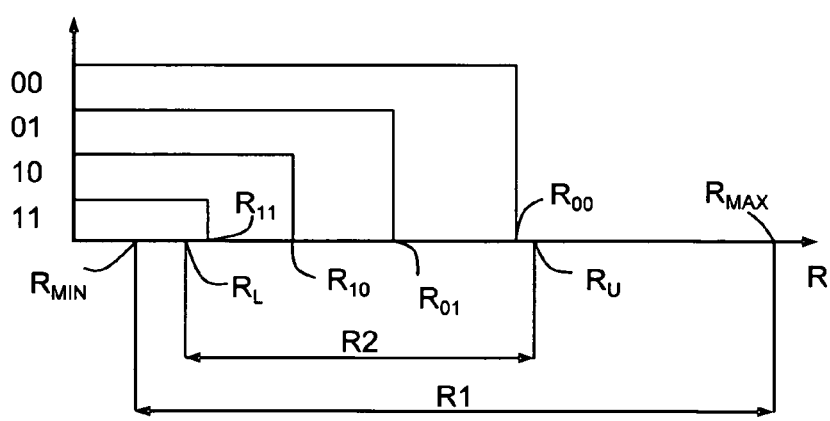
FIGS. 5 and 6 are plots showing quantities relating to the first embodiment the present invention.

With a 90 nm technology, resistance may generally vary in a first (maximum) range R1, e.g. from about 5 kΩ to about 500 kΩ. Referring to FIG. 5, the memory elements 10 may show a minimum resistance level $R_{MIN}$ in the fully set (crystalline) state and a maximum resistance level $R_{MAX}$ in the fully reset (amorphous) state. Intermediate resistance levels correspond to intermediate states in which both the crystalline phase and the amorphous phase are present in the memory elements 10. The smaller the extent of the crystallites 25, the higher the resistance of the memory element 10; the greater the extent of the crystallites 25, the lower is the resistance of the memory element 10. For example, four separate programming levels "00", "01", "10", "11", corresponding to respective resistance levels $R_{00}$, $R_{01}$, $R_{10}$, $R_{11}$, may be selected to store two bits in each PCM cell 2 (see FIG. 5).

The PCM cells 2 are driven by the program circuit 7a so that crystallites 25 are preserved in any allowable programming state. In practice, the resistance values associated with the allowable programming states may be selected in a second range R2, which is smaller than the first range R1. The PCM cells 2 may be driven so that the memory elements 10 are never brought to either the fully reset state or the fully set state during normal operation. In particular, an upper limit $R_U$ of the smaller second range R2 is selected that is, far away from the maximum resistance level $R_{MAX}$ of the wider first range R1. For example, the upper limit $R_U$ of the second range R2 may be 60 kΩ, whereas the maximum resistance level $R_{MAX}$ may be 500 kΩ. A suitable value for a lower limit $R_L$ of the second range R2 may be 10 kΩ, the minimum resistance level $R_{MIN}$ may be 5 kΩ.

Figure 6:
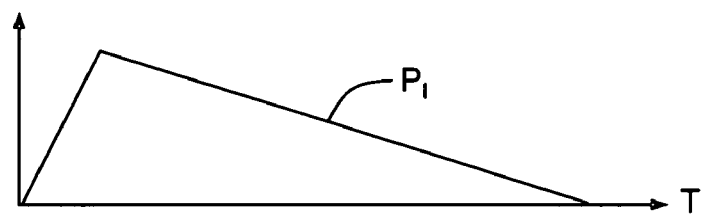
Figure 7:
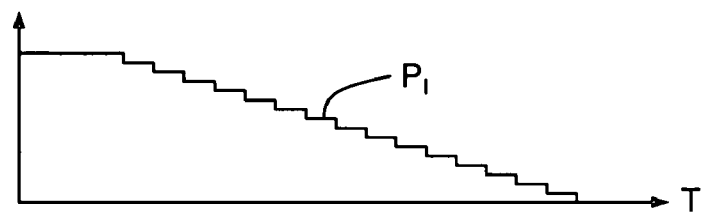
FIG. 7 is a plot relating to a variant of the first embodiment of the present invention.

All the PCM cells 2 may be initialized once after manufacturing, in order to reduce the variability of their programming characteristics. To this end, the program circuit 7a supplies all the PCM cells 2 with a single initialization pulse $P_I$ (FIG. 6) having an amplitude and duration to bring the chalcogenic material of the memory elements 10 first to the fully reset state and then to the fully set state. The chalcogenic material is thus made more uniform and possible irregularities are removed. Preferably, the initialization pulse $P_I$ is a current or voltage sloped pulse that allows slow cool off of the chalcogenic material. As an alternative, a decreasing stepped ramp would be acceptable as well (FIG. 7).

Figure 8A:
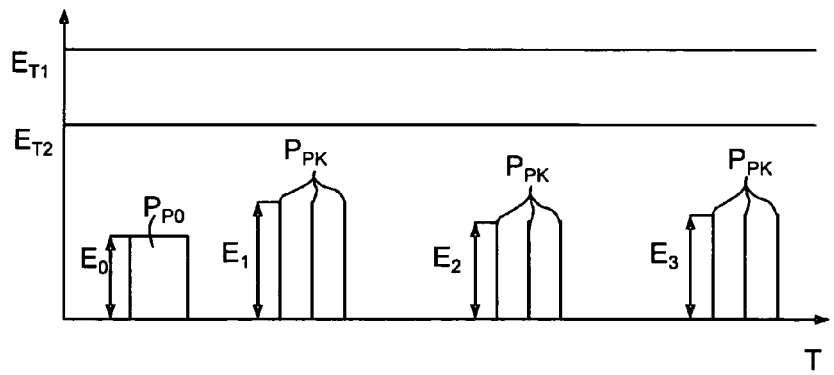
FIGS. 8*a*-8*c* are plots showing quantities relating to the first embodiment the present invention.
Figure 8B:
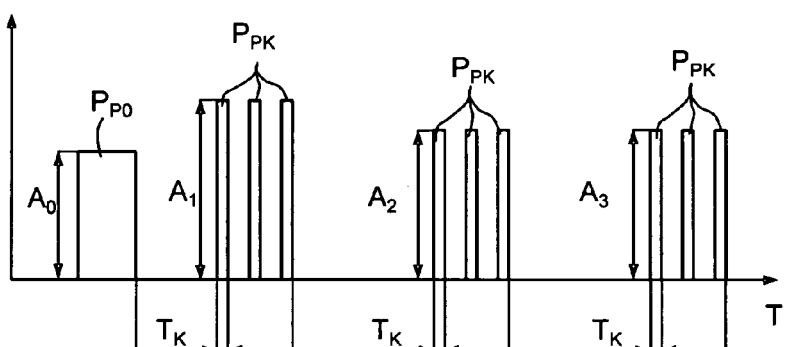
Figure 8C:
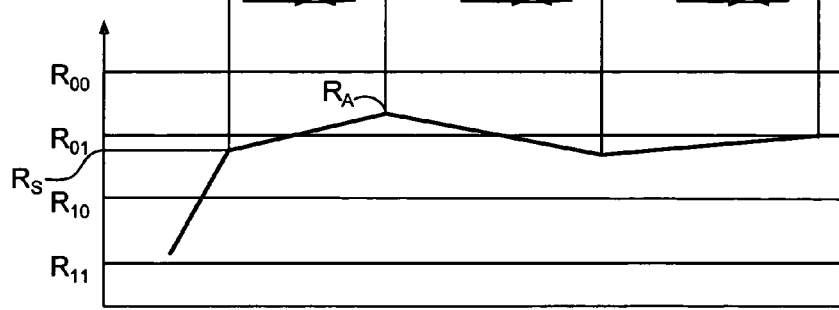

During normal operation of the PCM device 1, only programming pulses $P_{P0}$, $P_{PK}$ may be supplied to selected PCM cells 2 (see FIGS. 8a-8c). In particular, the program circuit 7a may be configured to provide a start programming pulse $P_{P0}$ and a plurality of adjust programming pulses $P_{PK}$. With reference to FIG. 8a, a start programming energy $E_0$ (associated with the start programming pulse $P_{P0}$) and adjust programming energies $E_1$-$E_3$ (respectively associated with the adjust programming pulses $P_{PK}$) are lower than a first threshold energy $E_{T1}$, and a second threshold energy $E_{T2}$, which are required to bring the chalcogenic material forming the memory elements 10 to the reset state and to the set state, respectively.

The start programming pulse $P_{P0}$, having a start energy $E_0$, has an amplitude and duration to bring the memory elements 10 of the selected PCM cells 2 to an intermediate resistance level $R_S$, (e.g. 35 kΩ) (FIGS. 8b and 8c). During this step, crystallites 25 are formed in the chalcogenic material and, if any were already present, they are preserved. The chalcogenic material forming the memory element 10 is thus brought to a start state corresponding to a start resistance $R_S$.

Then, one or more program/verify cycles are carried out by sending groups of adjust programming pulses $P_{PK}$ to the selected PCM cells 2 and subsequently reading the output currents or voltages thereof. Preferably, all the adjust programming pulses $P_{PK}$ have a same fixed duration $T_K$, so that the programming energy associated with each adjust programming pulse $P_{PK}$ is determined only by its amplitude.

More specifically, in a first program/verify cycle, the program circuit 7a supplies a first group of adjust programming pulses $P_{PK}$, having a first amplitude $A_1$, which amplitude depends on the resistance level corresponding to a target programming state to be reached. In the example of FIGS. 8a-8c, the programming state "01", having the target resistance level $R_{01}$, is selected as the target programming state. A first adjust energy $E_1$ is associated with the first group of adjust programming pulses $P_{PK}$. The extension of the previously formed crystallites 25 is thus reduced and the balance between the extensions of crystalline regions and amorphous regions is slightly shifted in favor of the latter. However, crystallites 25 are never destroyed, because the adjust programming pulses $P_{PK}$ do not have sufficient energy. The chalcogenic material forming the memory elements 10 is thus brought to an intermediate state having an intermediate actual resistance level $R_A$.

The verify circuit 7b reads the selected PCM cells 2. The reading may be done by applying a predetermined voltage and comparing resulting currents through the selected PCM cells 2 with predetermined reference currents, which correspond to respective resistance levels and programming states.

If the target resistance level $R_{01}$, corresponding to the target programming state "01" for the selected PCM cells 2, has not been reached, the program circuit 7a supplies a second group of adjust programming pulses $P_{PK}$, having a second amplitude $A_2$. The second amplitude $A_2$ of the second group of adjust programming pulses $P_{PK}$ is now selected based on the difference between the actual resistance level $R_A$ and the target resistance level $R_{01}$. In the example of FIGS. 8a-8c, the PCM cells 2 are over-reset and their resistance is to be reduced. Hence, the second amplitude $A_2$ is lower than the first amplitude $A_1$. Hence, also a second adjust energy E2 associated with the second group of adjust programming pulses $P_{PK}$ is lower than the first adjust energy $E_1$. The selected PCM cells 2 are read again by the verify circuit 7b.

Program/verify cycles are repeated until the target resistance level $R_{01}$, corresponding to the target programming state "01" for the selected PCM cells 2, is reached within a predetermined tolerance. In the example of FIGS. 8a-8c, a third group of adjust programming pulses $P_{PK}$, having a third amplitude $A_3$ and a third adjust energy $E_3$ are delivered to the selected PCM cells 2.

The amplitudes and energies of the adjust programming pulses $P_{PK}$ are selected based on any suitable convergent strategy, such as a binary selection algorithm.

Due to the preservation of crystallites in any operating condition (programming states and transitions), the resistivity drift in chalcogenides may be overcome, allowing effective multilevel programming. In particular, low resistivity paths may be established through the chalcogenic material, including adjacent crystallites 25 and small amorphous separation regions 26 which separate the crystallites from one another. In some embodiments, because of the reduced extension of the amorphous separation regions along the low resistivity paths, the resistivity drift may be negligible and stable programming states may be achieved. Also high resistivity paths may be established, which are formed by continuous amorphous regions extending for a substantial amount across the chalcogenic material. However, since such regions would be substantially parallel to the low resistivity paths, their contribution would be negligible as well, although the resistivity drift is possibly high.

Moreover, in some embodiments fine adjustment of the resistance levels of the PCM cells is possible, because resistance is controlled by slightly modifying the extensions of the crystallites in the chalcogenic material and any discontinuities may be avoided in some embodiments.

Figure 9:
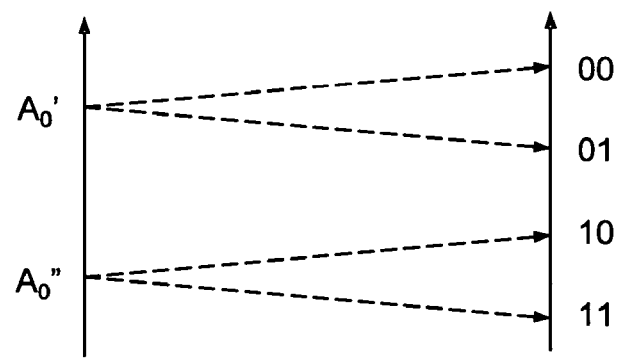
FIG. 9 is a graph showing quantities relating to a method according to an alternative embodiment of the present invention.

Referring next to FIG. 9, the start programming pulses $P_{P0}$ are selectable in a predetermined set of values. In this example, two separate amplitudes are available in a four-level memory device. The start programming pulses $P_{P0}$ have a first amplitude $A_0'$ when one of the programming states having higher resistance ("00", "01") is selected as the target programming state; and a second amplitude $A_0''$, lower than the first amplitude $A_0'$, when one of the programming states having lower resistance ("10", "11") is selected as the target programming state. Accordingly, the average programming time is reduced, because the starting condition is closer to the target programming state.

Figure 10:
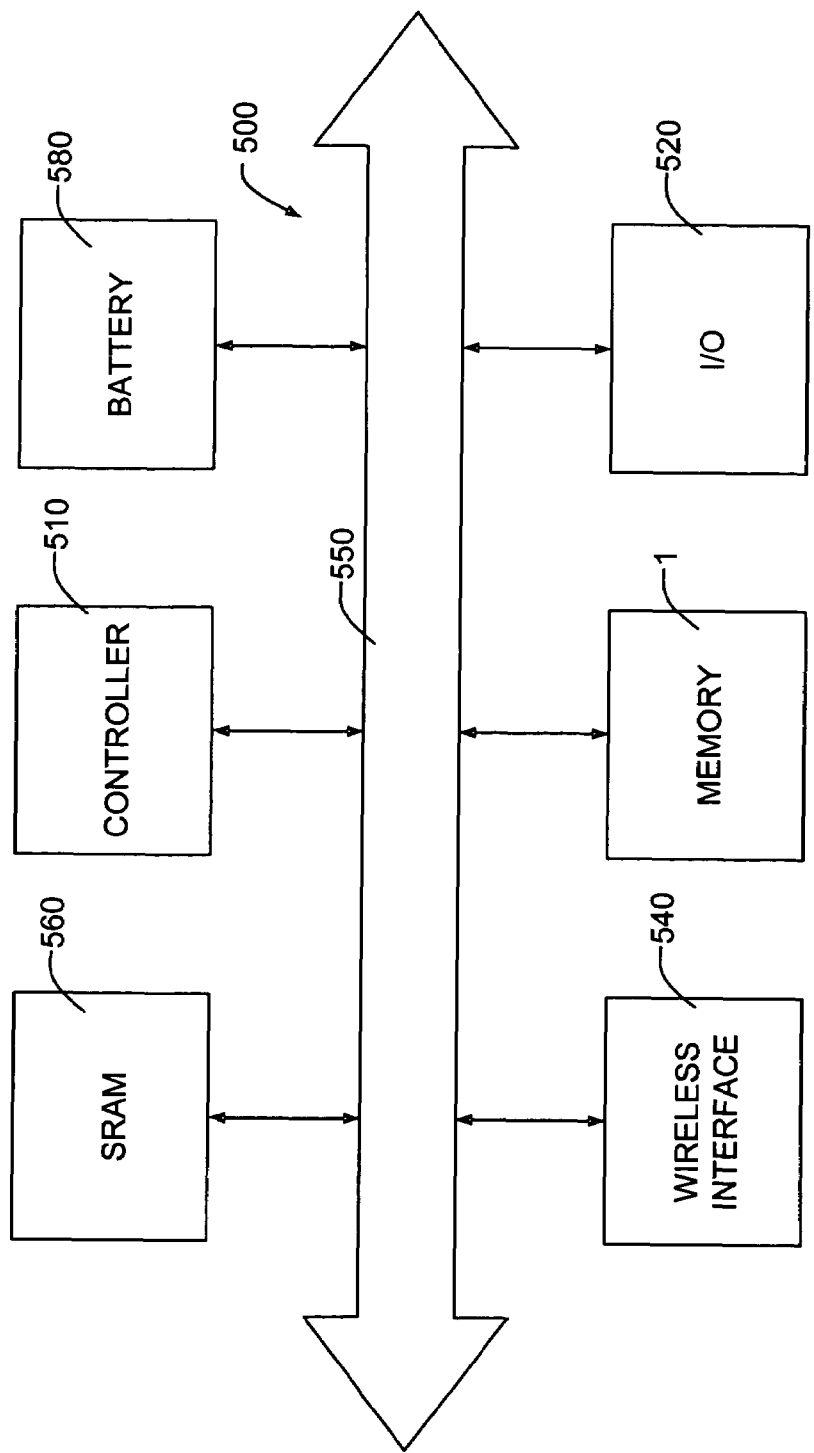
FIG. 10 is a system depiction of one embodiment of the present invention.

In FIG. 10, a portion of a system 500 in accordance with an embodiment of the present invention is described. System 500 may be used in wireless devices such as, for example, a personal digital assistant (PDA), a laptop or portable computer with wireless capability, a web tablet, a wireless telephone, a pager, an instant messaging device, a digital music player, a digital camera, or other devices that may be adapted to transmit and/or receive information wirelessly. System 500 may be used in any of the following systems: a wireless local area network (WLAN) system, a wireless personal area network (WPAN) system, or a cellular network, although the scope of the present invention is not limited in this respect.

System 500 may include a controller 510, an input/output (I/O) device 520 (e.g. a keypad, display), the phase change memory device 1, a wireless interface 540, and a static random access memory (SRAM) 560 and coupled to each other via a bus 550. A battery 580 may supply power to the system 500 in one embodiment. It should be noted that the scope of the present invention is not limited to embodiments having any or all of these components.

Controller 510 may comprise, for example, one or more microprocessors, digital signal processors, micro-controllers, or the like. The phase change memory device 1 may be used to store messages transmitted to or by system 500. The phase change memory device 1 may also optionally be used to store instructions that are executed by controller 510 during the operation of system 500, and may be used to store user data.

The I/O device 520 may be used to generate a message. The system 500 may use the wireless interface 540 to transmit and receive messages to and from a wireless communication network with a radio frequency (RF) signal. Examples of the wireless interface 540 may include an antenna, or a wireless transceiver, such as a dipole antenna, although the scope of the present invention is not limited in this respect.

While an example in a wireless application is provided above, embodiments of the present invention may also be used in non-wireless applications as well.

Finally, it is clear that numerous variations and modifications may be made to programming method and to the phase change memory device described and illustrated herein, all falling within the scope of the invention as defined in the attached claims. In particular, the invention is not limited to the PCM cell structure as described above. Any kind of selecting elements and memory elements may be used, as well as any suitable shape of heating elements (wall heating elements, lance heating elements or other).

What is claimed is:

1. A phase change memory device, comprising:
a plurality of phase change memory cells; and
a program circuit to provide a plurality of cell programming pulses having programming energies that are insufficient to bring phase change memory cells to a fully amorphous state, and to initialize a phase change memory by providing an initialization pulse having such amplitude and duration to bring a chalcogenide material to a fully reset state and then to a fully set state.

2. The phase change memory device of claim 1, wherein said program circuit to provide at least a start programming pulse to bring said phase change memory cells to a start intermediate state and an adjust programming pulse to bring said phase change material to a target intermediate state having a target resistance level.

3. The phase change memory device of claim 1, wherein said program circuit to repeatedly provide groups of said adjust programming pulses having a predetermined duration and an amplitude and further comprising a verify circuit to read said phase change memory cells after each group of said adjust programming pulses.

4. A system comprising:
a processing unit;
a nonvolatile phase change memory device including a plurality of phase change memory cells; and
a program circuit to provide a plurality of cell programming pulses having programming energies that are insufficient to bring phase change memory cells to a fully amorphous state, and to initialize a phase change memory by providing an initialization pulse having such amplitude and duration to bring a chalcogenide material to a fully reset state and then to a fully set state.

5. The system according to claim 4, wherein said interface includes a dipole antenna.

6. The system of claim 4, wherein said program circuit to maintain crystallites in said cells in all programming states.

7. The system of claim 4, wherein said program circuit to prevent said cells from becoming substantially crystalline.

8. The system of claim 4, wherein said program circuit to provide at least a start programming pulse to bring said phase change memory cells to a start intermediate state and an adjust programming pulse to bring said phase change material to a target intermediate state having a target resistance level.

9. The system of claim 8, wherein said program circuit to repeatedly provide groups of said adjust programming pulses having a predetermined duration and an amplitude and further comprising a verify circuit to read said phase change memory cells after each group of said adjust programming pulses.

* * * * *